US012615767B2

(12) United States Patent
Hong et al.

(10) Patent No.:  US 12,615,767 B2
(45) Date of Patent:       Apr. 28, 2026

(54) MULTI-STACK NANOSHEET STRUCTURE INCLUDING SEMICONDUCTOR DEVICE

(71) Applicant: SAMSUNG ELECTRONICS CO., LTD., Suwon-si (KR)

(72) Inventors: Byounghak Hong, Albany, NY (US);
Seungchan Yun, Waterford, NY (US);
Jaehong Lee, Albany, NY (US);
Kang-ill Seo, Albany, NY (US)

(73) Assignee: SAMSUNG ELECTRONICS CO., LTD. (KR)

( * ) Notice: Subject to any disclaimer, the term of this patent is extended or adjusted under 35 U.S.C. 154(b) by 687 days.

(21) Appl. No.: 17/977,575

(22) Filed: Oct. 31, 2022

(65) Prior Publication Data

US 2024/0023326 A1      Jan. 18, 2024

Related U.S. Application Data

(60) Provisional application No. 63/388,381, filed on Jul. 12, 2022.

(51) Int. Cl.
H10B 20/25          (2023.01)

(52) U.S. Cl.
CPC ................................... H10B 20/25 (2023.02)

(58) Field of Classification Search
CPC ...... H10B 20/25; H10D 30/60; H10D 30/014;
H10D 30/43; H10D 64/027; H10D
30/6757; H10D 64/017; H10D 30/6735;
H10D 62/151; H10D 64/513; H10D
64/518; H10D 62/121; H10D 84/0167;

H10D 84/038; H10D 84/40; H10D
84/401; H10D 84/856; H10D 88/00;
H10D 88/01; B82Y 10/00; H01L 23/5256
See application file for complete search history.

(56) References Cited

U.S. PATENT DOCUMENTS

| | | | |
|---|---|---|---|
| 9,947,743 B2 | 4/2018 | Doris et al. | |
| 10,461,195 B2 | 10/2019 | Kwon et al. | |
| 10,727,352 B2 | 7/2020 | Bi et al. | |
| 11,289,591 B1 * | 3/2022 | Su | H10D 10/60 |
| 11,616,151 B2 * | 3/2023 | Wang | H10D 84/83 |
| | | | 257/288 |

(Continued)

*Primary Examiner* — Yasser A Abdelaziez
(74) *Attorney, Agent, or Firm* — Myers Bigel, P.A.

(57) ABSTRACT

Provided is a multi-stack nanosheet structure that includes: at least a first nanosheet structure and at least a second nanosheet structure, above the substrate, separated from each other, wherein the first nanosheet structure and second nanosheet structure are adjacent to each other; a channel structure comprising a first portion on the first nanosheet structure, a second portion on the second nanosheet structure, and a third portion on the substrate between the first and second portions, wherein the first portion, the second portion and the third portion form a single continuous structure; a gate structure between the first and second portions on the third portion of the channel structure, wherein the gate structure comprises a gate dielectric layer comprising oxide; and at least a first source/drain region on the first nanosheet structure, and at least a second source/drain region on the second nanosheet structure, wherein the first source/drain region and the second source/drain region include an n-type or p-type dopant.

25 Claims, 13 Drawing Sheets

(56)  References Cited

U.S. PATENT DOCUMENTS

| | | | |
|---|---|---|---|
| 2009/0085119 A1* | 4/2009 | Ernst | H10D 30/024 |
| | | | 257/E29.264 |
| 2019/0081145 A1 | 3/2019 | Xie et al. | |
| 2019/0131394 A1* | 5/2019 | Reznicek | H10D 30/6739 |
| 2019/0131396 A1* | 5/2019 | Zhang | B82Y 10/00 |
| 2019/0214482 A1 | 7/2019 | Xie et al. | |
| 2021/0035870 A1 | 2/2021 | Young et al. | |
| 2022/0115500 A1 | 4/2022 | Choi et al. | |
| 2022/0165730 A1* | 5/2022 | Chen | H10D 84/0186 |

* cited by examiner

MULTI-STACK NANOSHEET STRUCTURE INCLUDING SEMICONDUCTOR DEVICE

CROSS-REFERENCE TO THE RELATED APPLICATION

This application is based on and claims priority from U.S. Provisional Application No. 63/388,381 filed on Jul. 12, 2022 in the U.S. Patent and Trademark Office, the disclosure of which is incorporated herein in its entirety by reference.

BACKGROUND

1. Field

Apparatuses and methods according to embodiments relate to a multi-stack nanosheet structure in which at least one semiconductor device is formed.

2. Description of the Related Art

Growing demand for integrated circuits having high device performance and density has introduced a three-dimensional (3D) multi-stack semiconductor device in which two or more nanosheet transistors are vertically stacked. The nanosheet transistor is characterized by one or more nanosheet channel layers vertically stacked on a substrate and a gate structure surrounding the nanosheet channel layers. Thus, the nanosheet transistor is referred to as gate-all-around (GAA) transistor, or a multi-bridge channel field-effect transistor (MBCFET).

In a multi-stack semiconductor device including a lower nanosheet transistor and an upper nanosheet transistor stacked thereabove, one or more nanosheet channel layers of each nanosheet transistor are formed as a channel structure of the nanosheet transistor, and these nanosheet channel layers are surrounded by a gate structure. The gate structure includes a gate dielectric layer surrounding each of the nanosheet channel layers, a work-function metal layer formed on the gate dielectric layer, and a gate electrode pattern formed on the work-function metal layer. The gate dielectric layer may include a channel interfacial layer and a high-k dielectric layer.

When there is a requirement for using the multi-stack semiconductor device as an input/output terminal in an integrated circuit reliably receiving an operation input signal at the gate structure, the gate dielectric layer needs to be formed as an extra gate (EG) oxide layer having a sufficient thickness so that an oxide component included in the gate dielectric layer can withstand an operating voltage of 1.0 V or greater without oxide breakdown. For example, the gate dielectric layer for an EG oxide layer may need a thickness of about 4.0-5.0 nm.

However, due to the high device density requirement for the multi-stack semiconductor device, a space between nanosheet channel layers may not provide a sufficient vertical distance so that the gate dielectric layer can be formed as an EG oxide layer and at least the work-function metal layer can be formed along with the gate dielectric layer to surround the nanosheet channel layers.

Thus, inventors of the present application have developed an inventive concept of completing the multi-stack nanosheet structure prepared for the multi-stack semiconductor device as different semiconductor devices.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides multi-stack nanosheet structures in which one or more semiconductor devices other than a nanosheet transistor is formed, and a method of manufacturing the same.

According to an embodiment, there is provided a multi-stack nanosheet structure which may include: at least a first nanosheet structure and at least a second nanosheet structure, above the substrate, separated from each other, wherein the first nanosheet structure and second nanosheet structure are adjacent to each other; a channel structure comprising a first portion on the first nanosheet structure, a second portion on the second nanosheet structure, and a third portion on the substrate between the first and second portions, wherein the first portion, the second portion and the third portion form a single continuous structure; a gate structure between the first and second portions on the third portion of the channel structure, wherein the gate structure comprises a gate dielectric layer comprising oxide; and at least a first source/drain region on the first nanosheet structure, and at least a second source/drain region on the second nanosheet structure, wherein the first source/drain region and the second source/drain region include an n-type or p-type dopant. Here, the left and right source/drain regions connected by the channel structure, and the gate structure may form a field-effect transistor.

According to an embodiment, first source/drain region includes a lower-first source/drain region and an upper-first source/drain region, one of which is on the lower-first nanosheet structure or the upper-first nanosheet structure, and wherein the second source/drain region includes a lower-second source/drain region and an upper-second source/drain region, one of which is on the lower-second nanosheet structure or the upper-second nanosheet structure.

According to an embodiment, the first source/drain region includes a lower-first source/drain region and an upper-first source/drain region, one of which is on the lower-first nanosheet structure or the upper-first nanosheet structure, and wherein the second source/drain region includes a lower-second source/drain region and an upper-second source/drain region, one of which is on the lower-second nanosheet structure or the upper-second nanosheet structure.

According to an embodiment, the multi-stack nanosheet structure may further include: a first source/drain region contact plug on the lower-second source/drain region or the upper-second source/drain region which comprises the n-type or p-type dopant; a second source/drain region contact plug on the lower-second source/drain region or the upper-second source/drain region which comprises the n-type or p-type dopant; and a gate contact plug on the gate structure.

According to an embodiment, there is provided a multi-stack nanosheet structure which may include: a substrate; at least a first nanosheet structure and at least a second nanosheet structure above the substrate separated from each other; a channel structure including a first portion on the first nanosheet structure, a second portion on the second nanosheet structure, and a central portion on the substrate between the first and second portions, wherein the first portion, the central portion and the second portion form a single continuous structure; and at least a first source/drain region on the first nanosheet structure, and at least a second source/drain region on the second nanosheet structure, wherein the channel structure includes an n-type of p-type dopant, and the first source/drain region and the second source/drain region include a dopant having a polarity opposite to the n-type of p-type dopant in the channel structure. Here, the first and second source/drain regions and the channel structure may form a bipolar junction transistor (BJT).

According to an embodiment, there is provided a multi-stack nanosheet structure which may include: a substrate; at least one left nanosheet structure and at least one right nanosheet structure above the at least a first nanosheet structure and at least a second nanosheet structure above the substrate separated from each other; and at least a first source/drain region on the first nanosheet structure, and at least a second source/drain region on the second nanosheet structure, wherein the substrate comprises an n-type of p-type dopant, and the first source/drain region and the second source/drain region comprise a dopant having a polarity opposite to the n-type of p-type dopant in the substrate. Here, the first and second source/drain regions and the channel structure may form a bipolar junction transistor (BJT).

According to an embodiment, there is provided a method of manufacturing a multi-stack nanosheet structure. The method may include: providing an intermediate structure including at least one nanosheet channel layer on a substrate, and at least a first source/drain region and at least a second source/drain region respectively at both ends of the nanosheet channel layer; forming a trench on the substrate by removing central portions of the nanosheet channel layer so that both end portions thereof form at least a first nanosheet structure and at least a second nanosheet structure; forming, in the trench, a channel structure including a first portion on the first nanosheet structure, a second portion on the second nanosheet structure, and a central portion on the substrate between the first and second portions, wherein the first portion, the central portion and the second portion form a single continuous structure; and forming a gate structure between the first and second portions on the central portion of the channel structure, wherein the gate structure includes a gate dielectric layer comprising oxide, wherein the first source/drain region and the second source/drain region include an n-type or p-type dopant.

BRIEF DESCRIPTION OF DRAWINGS

Example embodiments of the inventive concept will be more clearly understood from the following detailed description taken in conjunction with the accompanying drawings in which:

FIGS. 4A to 4G illustrate a method of manufacturing a multi-stack nanosheet structure including a U-shaped channel structure device, according to an embodiment;

FIGS. 5A to 5C illustrate a method of manufacturing a multi-stack nanosheet structure including a U-shaped channel structure device and a small-size gate structure, according to an embodiment;

DETAILED DESCRIPTION OF EXAMPLE EMBODIMENTS

Figure 1A:
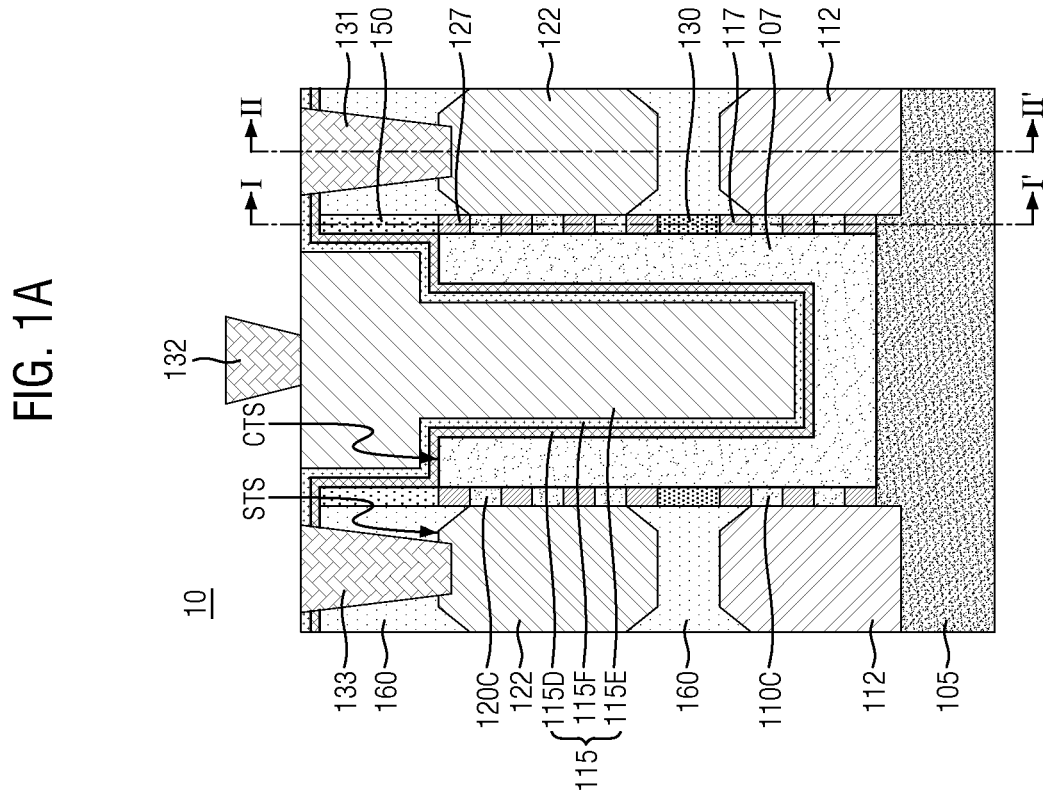
FIGS. 1A-1C illustrate a multi-stack nanosheet structure in which a field-effect transistor including a U-shaped channel structure is formed, according to an embodiment.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, nanosheet sacrificial layers, sacrificial isolation layers and channel isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "first" element or a "second" element, respectively, as long as their structural relationship is clearly understood in the context of the descriptions. Similarly, the terms a "lower" element and an "upper" element may be respectively referred to as a "first" element and a "second" element with necessary descriptions to distinguish the two elements.

It will be understood that, although the terms "first," "second," "third," "fourth," etc. may be used herein to describe various elements, these elements should not be limited by these terms. These terms are only used to distinguish one element from another element. Thus, a first element discussed below could be termed a second element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a nanosheet transistor structure may or may not be described in detail herein. For example, a certain isolation layer or structure of a semiconductor device may be omitted herein when this layer or structure is not related to the various of aspects of the embodiments.

Figure 1C:
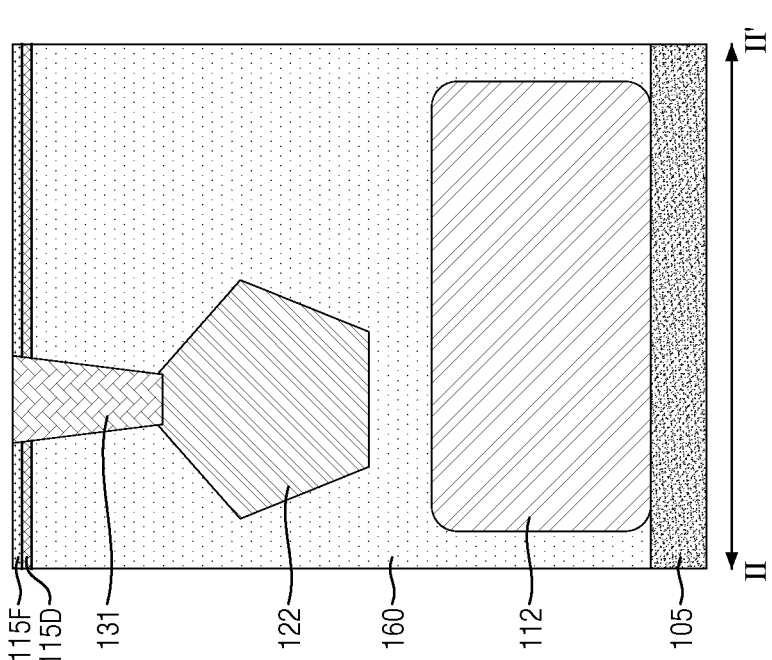
Figure 1B:
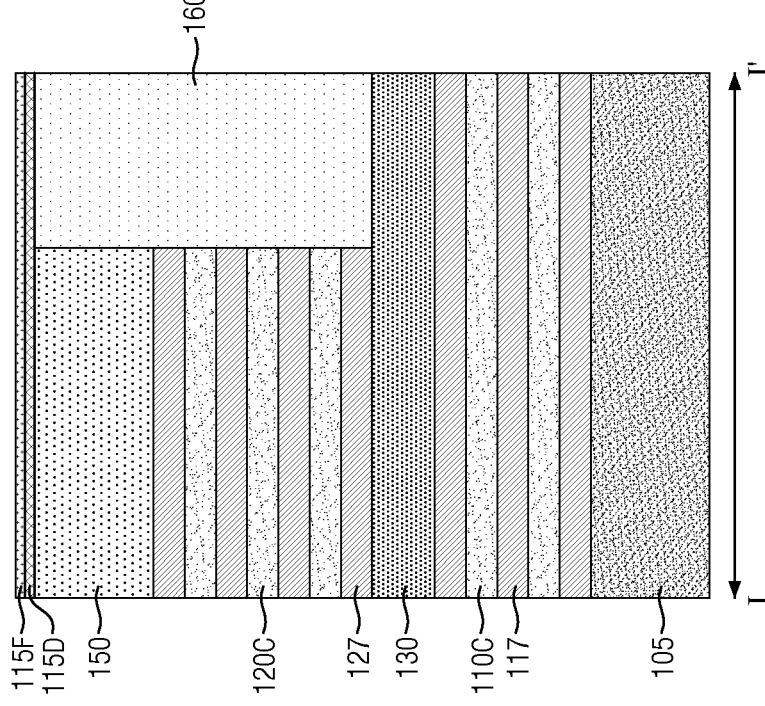

FIGS. 1A-1C illustrate a multi-stack nanosheet structure in which a field-effect transistor including a U-shaped channel structure is formed, according to an embodiment. FIG. 1A is a channel-length direction view of the multi-stack nanosheet structure, and FIGS. 1B and 1C are channel-width direction views of the multi-stack nanosheet structure taken along lines I-I' and II-II', respectively, according to embodiments.

According to an embodiment, a multi-stack nanosheet structure 10 shown in FIGS. 1A-1C may be a semiconductor device obtained from an intermediate structure configured to form a multi-stack semiconductor device which would include a lower nanosheet transistor and an upper nanosheet transistor stacked thereon. Thus, structural elements included in the multi-stack nanosheet structure 10 may include those or portions thereof forming the intermediate structure of the multi-stack semiconductor device.

Referring to FIG. 1A, the multi-stack nanosheet structure 10 may include a U-shaped channel structure 107 which has a shape of a character "U" on a top surface of the substrate 105. According to an embodiment, the U-shaped channel structure 107, a pair of upper source/drain regions 122 connected to each other through the U-shaped channel structure 107, and a gate structure 115 formed on the U-shaped channel structure 107 may form an extra gate (EG) oxide field effect transistor, as will be described later.

On an outer surface of the U-shaped channel structure 107, may be formed a plurality of lower nanosheet structures 110C and upper nanosheet structures 120C, a plurality of lower inner spacers 117 and upper inner spacers 127, and an isolation layer 130. On an inner surface of the U-shaped channel structure 107, may be formed the gate structure 115 including a gate dielectric layer 115D, a work-function metal layer 115F and a gate electrode pattern 115E.

The U-shaped channel structure 107 may be an epitaxy structure that is grown from the substrate 105 and the nanosheet structures 110C and 120C, according to an embodiment. The U-shaped channel structure 107 may be a single-continuous structure formed of a left (or first) portion, a right (or second) portion, and a central (or third) portion, according to an embodiment. However, depending on how an epitaxy technique is performed on the substrate 105 and the nanosheet structures 110C and 120C in a process of manufacturing the multi-stack nanosheet structure 10, the U-shaped channel structure 107 may have a different shape, according to embodiments.

The lower nanosheet structures 110C and the upper nanosheet structures 120C may be end portions of a plurality of lower nanosheet channel layers and upper nanosheet channel layers which remain after a removal operation is performed on these nanosheet channel layers in the process of manufacturing the multi-stack nanosheet structure 10, as will be described later in FIGS. 4A-4G. Prior to the removal operation, these nanosheet channel layers may have been included in the intermediate structure as nanosheet channel structures for the lower nanosheet transistor and the upper nanosheet transistor of the multi-stack semiconductor device.

The substrate 105 may be a silicon (Si) substrate although it may include other materials such as silicon germanium (SiGe), silicon carbide (SiC), not being limited thereto. The nanosheet structures 110C and 120C may also be formed of the same materials forming the substrate 105 because the nanosheet channel layers which would become the nanosheet structures 110C and 120C have been grown from the substrate 105 through an epitaxy process. The U-shaped channel structure 107 may also include the same or similar materials forming the substrate 105 or the nanosheet structures 110C and 120C.

As described earlier, the gate structure 115 may be formed on the U-shaped channel structure 107. As the U-shaped channel structure 107 has the shape of the character "U," the gate structure 115 including the gate dielectric layer 115D, the work-function metal layer 115F and a gate electrode pattern 115E formed on the U-shaped channel structure 107 may take a shape of a character "T." Thus, when the U-shaped channel structure 107 is formed to have a different shape, the shape of the gate structure 115 may also change, according to an embodiment.

A vertical portion (lower portion) of the gate structure 115 having the T shape may be disposed inside two vertical portions (left and right portions) of the U-shaped channel structure 107 on a horizontal portion (central portion) thereof. Further, a horizontal portion (upper portion) of the gate structure 115 having the T shape may be disposed above a level of a top surface CTS of the U-shaped channel structure 107. However, as will be described later in reference to FIG. 3, the shape of the gate structure 115 may also not be limited to the T shape shown in FIG. 1, according to embodiments. On outer surfaces of the horizontal portion of the gate structure 115, may be formed gate spacers 150. The gate spacers 150 may be structural elements used as a mask structure to form inner spacers 117 and 127 in the intermediate structure of the multi-stack semiconductor device, according to an embodiment.

For the gate structure 115 to be formed on the U-shaped channel structure 107, the gate dielectric layer 115D with the work-function metal layer 115F thereon may be layered on the U-shaped channel structure 107 and the gate spacers 150, and the gate electrode pattern 115E may be formed on the work-function metal layer 115F.

According to an embodiment, the gate dielectric layer 115D may be formed as an extra gate (EG) oxide layer having a thickness of, for example, about 4-5 nm, so that the gate dielectric layer 115D may have a high oxide breakdown voltage. As described in the Background section, a gate dielectric layer having a sufficient thickness for an EG oxide layer may not be formed on a narrow space between the nanosheet channel layers prepared to form the nanosheet channel structures of the multi-stack semiconductor device. However, the gate dielectric layer 115D having a sufficient thickness to achieve an EG oxide layer may be easily formed on the U-shaped channel structure 107 without space limitation, according to an embodiment.

The gate dielectric layer 115D formed as an EG oxide layer may further include a high-k layer formed of hafnium oxide, hafnium silicate, hafnium oxynitride, hafnium silicon oxynitride, hafnium aluminum oxide, lanthanum oxide, lanthanum aluminum oxide, zirconium oxide, zirconium silicate, zirconium oxynitride, zirconium silicon oxynitride, titanium oxide, barium strontium titanium oxide, barium titanium oxide, strontium titanium oxide, yttrium oxide, aluminum oxide, tantalum oxide and/or lead scandium tantalum oxide, not being limited thereto. The high-k layer may be provided to allow an increased gate capacitance without associated current leakage at the U-shaped channel structure 107.

The lower source/drain regions 112, i.e., a lower-left (or lower-first) source/drain region and a lower-right (or lower-second) source/drain region, may be respectively formed on at least one lower-left (or lower-first) one and at least one lower-right (or lower-second) one of the lower nanosheet structures 110C. The upper source/drain regions 122, i.e., an upper-left source/drain region and an upper-right source/drain region, may be respectively formed on at least one upper-left one and at least one upper-right one of the upper nanosheet structures 120C. The source/drain regions 112 and 122 may be disposed at both sides of the U-shaped channel structure with the nanosheet structures 110C, 120C and the inner spaces 117, 127 therebetween.

The lower source/drain regions 112 and the upper source/drain regions 122 may have been epitaxially grown from at least one of the lower nanosheet channel layers and at least one of the upper nanosheet channel layers included in the intermediate structure of the multi-stack semiconductor device, according to an embodiment. As will be described later in FIGS. 4A-4G, the lower source/drain regions 112 were connected to each other through at least one of the lower nanosheet channel layers before a central portion of this layer was removed leaving only the end portions thereof which are now the lower nanosheet structures 110C for the multi-stack nanosheet structure 10. Likewise, the upper source/drain regions 122 were connected to each other through at least one of the upper nanosheet channel layers before a central portion of this layer was removed leaving only the end portions thereof which are now the upper nanosheet structures 120C for the multi-stack nanosheet structure 10.

The lower source/drain regions 112 and/or the upper source/drain regions 122 may include one or more p-type or n-type dopants through epitaxial doping or ion implantation, depending on a type of field-effect transistor to be formed by the lower source/drain regions 112 and the upper source/drain regions 122 along with the U-shaped channel structure 107 and the gate structure 115. For example, the lower source/drain regions 112 may include a p-type dopant such as boron (B), gallium (Ga), etc. to form the field-effect transistor as a p-type field-effect transistor (PFET), and the upper source/drain regions 122 may include an n-type dopant such as phosphorous (As), arsenic (Sb), indium (In), etc. to form an n-type field-effect transistor (NFET). However, the embodiments are not limited thereto. The lower source/drain regions 112 may include an n-type dopant while the upper source/drain regions 122 include a p-type dopant. Further, the lower source/drain regions 112 and the upper source/drain regions 122 may all include an n-type dopants or a p-type dopant.

Referring to FIGS. 1B and 1C, the upper nanosheet structures 120C along with the upper inner spacers 127, may have a smaller width than the lower nanosheet structures 110C along with the lower inner spacers 117. Due to this width difference, the upper source/drain regions 122 grown from the upper nanosheet layers may also have a smaller width than the lower source/drain regions 112 grown from the lower nanosheet layers. This width difference was intended in the intermediate structure of the multi-stack semiconductor device to enable a lower source/drain region contact plug, which would be extended down from a back-end-of-line (BEOL) structure above the multi-stack semiconductor device, to land on a top surface of the lower source/drain region 112. Otherwise, if the lower source/drain regions 112 and the upper source/drain regions 122 have an equal width, the lower source/drain region contact plug would have to be bent and connected to a side surface of the lower source/drain region 112, the formation of which is difficult and error prone in manufacturing the multi-stack semiconductor device. As will be described later, this width difference intended for the multi-stack semiconductor device may also be utilized in the multi-stack nanosheet structure 10, according to embodiments.

An interlayer dielectric (ILD) structure 160 may be formed between the lower source/drain regions 112 and the upper source/drain regions 122 to isolate the lower source/drain regions 112 from the upper source/drain regions 122. The ILD structure 160 may also be formed above the upper source/drain regions 122 to isolate the upper source/drain regions 122 from other circuit elements in an integrated circuit including the multi-stack nanosheet structure 10. The ILD structure 160 may be further formed at sides of the upper nanosheet structure 120C, the upper inner spacers 127 and the gate spacer 150 on a portion of a top surface of isolation layer 130 to isolate the multi-stack nanosheet structure 10 from another structure in the integrated circuit, as shown in FIG. 2B. A material forming the ILD structure may be a low-k dielectric material such as silicon oxide.

The lower inner spacers 117 formed on the lower source/drain regions 112, and the upper inner spacers 127 formed on the upper source/drain regions 122 may also be structural elements of the intermediate structure of the multi-stack semiconductor device, according to an embodiment. In the lower nanosheet transistor and the upper nanosheet transistor of the multi-stack semiconductor device, the lower inner spacers 117 would isolate a gate structure surrounding the lower nanosheet layers from the lower source/drain regions 112, and the upper inner spacers 127 would isolate the gate structure surrounding the upper nanosheet layers from the upper source/drain regions 122. The inner spacers 117 and 127 both may be formed of silicon nitride or its equivalents.

The isolation layer 130 may be formed between the lower nanosheet structures 110C and the upper nanosheet structures 120C to isolate the lower nanosheet structures 110C from the upper nanosheet structures 120C. The isolation layer 130 may also be formed of silicon nitride or its equivalents.

The multi-stack nanosheet structure 10 may additionally include a gate contact plug 132 formed on a top surface the gate structure 115, and source/drain region contact plugs 131 and 133 respectively formed on top surfaces of the upper source/drain regions 122. These contact plugs 131-133 may each be a middle-of-line (MOL) structure in an integrated circuit including the multi-stack nanosheet structure 10. The gate contact plug 132 may receive and deliver a gate input signal to the gate structure 115 or connect the gate structure to another circuit element. The source/drain region contact plugs 131 and 133 may receive a power signal, or receive or transmit a routing signal for the upper source/drain regions 122 in the integrated circuit including the multi-stack nanosheet structure 10. The contact plugs 131-133 may be formed of a metal or metal compound including copper (Cu), tungsten (W), titanium (Ti), aluminum (Al), ruthenium (Ru), molybdenum (Mo), etc.

Thus, in the multi-stack nanosheet structure 10, the gate structure 115 including the gate dielectric layer 115D formed as an EG oxide layer, the work-function metal layer 115F and the gate electrode pattern 115E, the U-shaped channel structure 107, and the upper source/drain regions 122 may form a field-effect transistor which is manufactured based on the intermediate structure which would form the multi-stack semiconductor device including the lower nanosheet transistor and the upper nanosheet transistor.

According to an embodiment, the upper source/drain regions 122 may include one or more n-type or p-type dopants to form an n-type or p-type field-effect transistor (NFET or PFET), respectively, along with the U-shaped channel structure 107 and the gate structure 115. At this time, the lower source/drain regions 112 may also include one or more n-type or p-type dopants having the same polarity as the upper source/drain regions 122 or may not include any dopants, according to an embodiment.

However, the disclosure is not limited to only the above embodiments in which the upper source/drain regions 122 are connected to a power source or another circuit element through the source/drain region contact plugs 131 and 133 to form a corresponding field-effect transistor.

According to embodiments, at least one of the source/drain region contact plugs 131 and 133 may be connected to at least one of the lower source/drain regions 112 to drive the connected at least one lower source/drain region 112 to form a field-effect transistor along with the U-shaped channel structure 107 and the gate structure 115.

According to embodiments, one of the lower source/drain regions 112 (a lower-left source/drain region) and one of the upper source/drain regions 122 (an upper-right source/drain region) at an opposite side with respect to the U-shaped channel structure 107 and the gate structure 115 may form an NFET or a PFET by connecting the source/drain region contact plugs 131 and 133 thereto, respectively. This cross connection of the source/drain region contact plugs 131 and/or 133 may be made through a space provided at a side of the upper source/drain region 122 formed on a smaller-width upper nanosheet structures 120C and on the lower source/drain region 112 formed on a greater-width lower nanosheet structures 110C, as shown in FIG. 1C. However, this cross connection may also be made possible by securing an additional space at a side of the multi-stack nanosheet structure 10 when the lower nanosheet structures 110C and the upper nanosheet structures 120C have an equal width, according to embodiments.

Further, although not shown in the drawings, at least one of the source/drain region contact plugs 131 and 133 may be formed at a back side of the multi-stack nanosheet structure 10, for example, inside the substrate 105 or below the top surface of the substrate 105. Through this backside contact plug, at least one of the lower source/drain regions 112 may be connected to a power source or another circuit element when this lower source/drain region 112 is to form an NFET or a PFET with the U-shaped channel structure 107, the gate structure 115 and the other lower source/drain region 112 or the upper source/drain region 122 at an opposite side with respect to the U-shaped channel structure 107 and the gate structure 115.

Referring back to FIG. 1A, the U-shaped channel structure 107 in the multi-stack nanosheet structure 10 may have a top surface CTS at a substantially same level as a top surface STS of the upper source/drain regions 122 so that a substantial amount of the upper source/drain regions 122 overlaps the U-shaped channel structure 107 in a horizontal direction. However, this overlap amount may be reduced by lowering a height of the U-shaped channel structure 107 when the U-shaped channel structure 107 is formed in the process of manufacturing the multi-stack nanosheet structure 10. For example, an epitaxy amount or a time of growing the epitaxy structure for the U-shaped channel structure 107 may be controlled such that the U-shaped channel structure 107 has a small height in the multi-stack nanosheet structure 10, according to an embodiment. By controlling the height of the U-shaped channel structure 107, the multi-stack nanosheet structure 10 may have different device characteristics such as a current amount, device capacitance, a current leakage tolerance, etc. depending on how the field-effect transistor implemented by the multi-stack nanosheet structure 10 is to be used.

Figure 2:
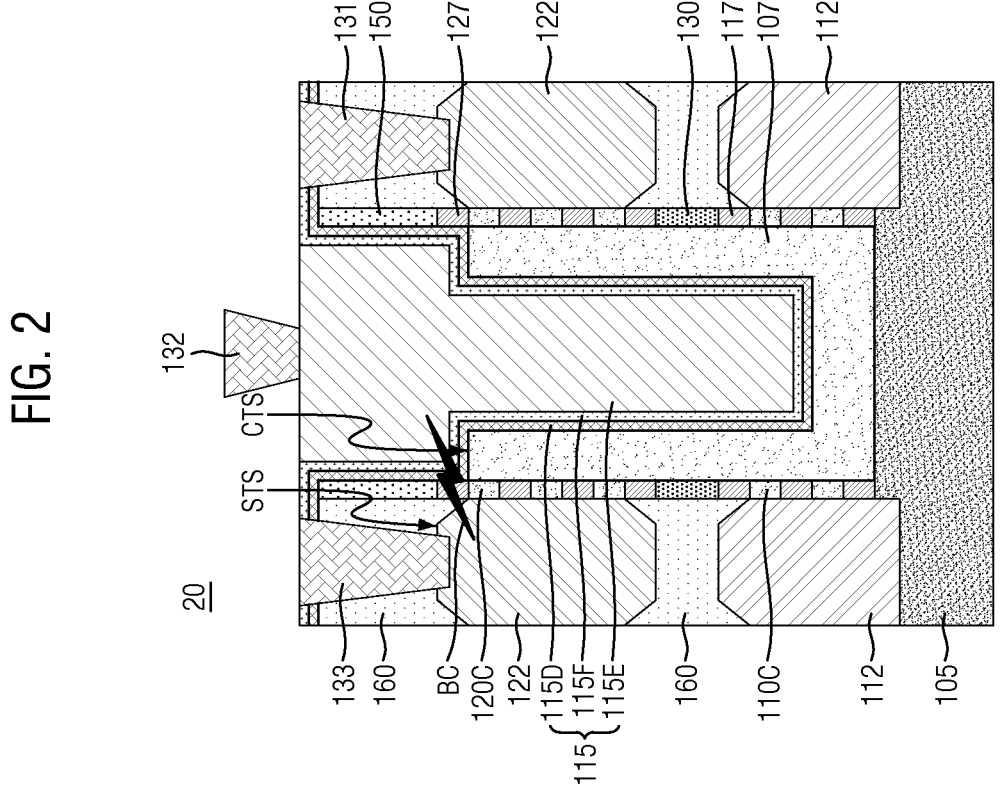
FIG. 2 illustrates a multi-stack nanosheet structure including a U-shaped channel structure device having a small height, according to an embodiment.

FIG. 2 illustrates a multi-stack nanosheet structure including a U-shaped channel structure device having a small height, according to an embodiment.

Referring to FIG. 2, a multi-stack nanosheet structure 20 has the same structures or elements as included in the multi-stack nanosheet structure 10 shown in FIGS. 1A-1C, except that the top surface CTS of the U-shaped channel structure 107 is lower than the top surface STS of the U-shaped channel structure 107 included in the multi-stack nanosheet structure 10. Thus, only different aspects of the multi-stack nanosheet structure 20 are described herebelow.

In the multi-stack nanosheet structure 20, the top surface CTS of the U-shaped channel structure 107 may be formed at a level lower than the top surface STS of the upper source/drain regions 122 in the multi-stack nanosheet structure 10 by growing the U-shaped channel structure 107 to have a small height. Still, however, the top surface CTS of the U-shaped channel structure 107 may be above a level of bottom surfaces of the upper source/drain regions 122. Thus, a degree of area overlap between the U-shaped channel structure 107 and the upper source/drain regions 122 becomes lower, while a distance between the gate structure 115 and the upper source/drain regions 122 becomes shorter because the horizontal portion of the gate structure 115 having the T shape becomes thicker.

Thus, the multi-stack nanosheet structure 20 shown in FIG. 2 may be used as an one-time programmable (OTP) electrical fuse (eFuse) in which a current may flow through a breakdown channel BC from the upper source/drain region 122 to the gate structure 115 when a high voltage, e.g., 3 V or more, is applied to the upper source/drain region 122 through the upper source/drain region contact plug 133 and a ground voltage is applied to the gate structure 115 through the gate contact plug 132.

The device characteristics of the FET including the U-shaped channel structure 107 in the multi-stack nanosheet structure 10 may also be controlled by differentiating a size of the gate structure 115.

Figure 3:
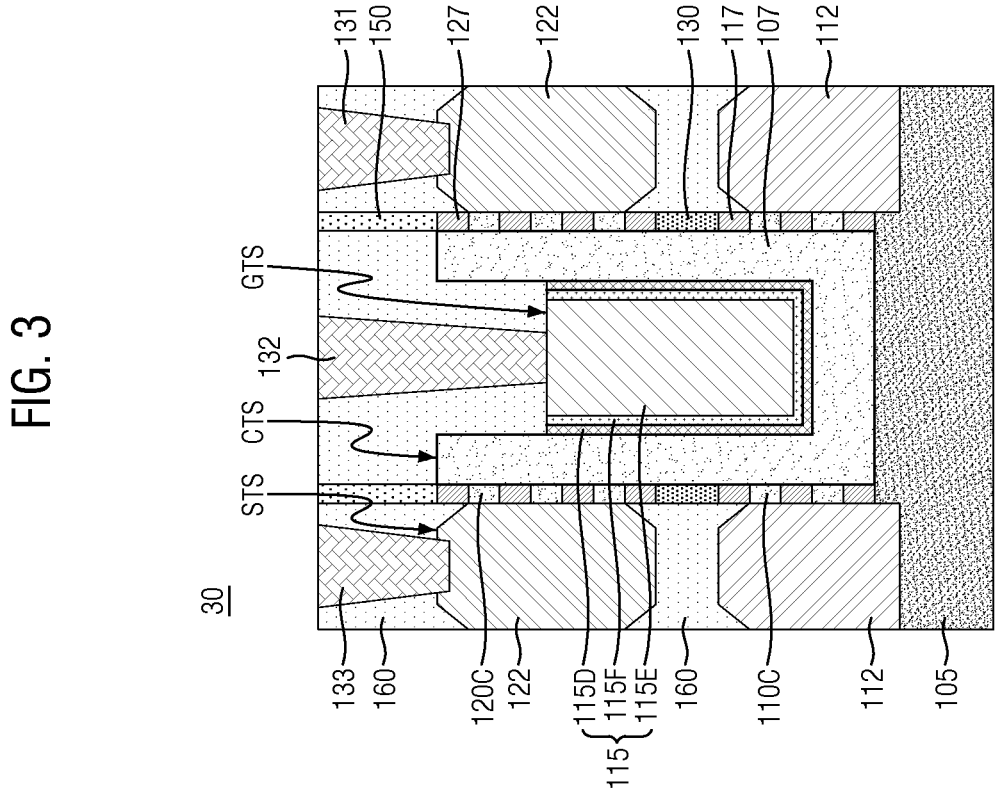
FIG. 3 illustrates a multi-stack nanosheet structure including a U-shaped channel structure device and a small-size gate structure, according to an embodiment.

FIG. 3 illustrates a multi-stack nanosheet structure including a U-shaped channel structure device and a small-size gate structure, according to an embodiment.

Referring to FIG. 3, a multi-stack nanosheet structure 30 has the same structures or elements as included in the multi-stack nanosheet structure 10 shown in FIGS. 1A-1C, except that the gate structure 115 has a different shape. Thus, only different aspects of the multi-stack nanosheet structure 20 are described herebelow.

In the multi-stack nanosheet structure 30, the gate structure 115 may be formed inside the U-shaped channel structure 107 and a top surface GTS of the gate structure 115 is lower than the top surface CTS of the U-shaped channel structure 107. Thus, the gate structure 115 in the multi-stack nanosheet structure 10 is not in the T shape like the gate structure 115 in the multi-stack nanosheet structures 10 and 20.

According to an embodiment, a degree of area overlap between the gate structure 115 and the upper source/drain regions 122, between which the U-shaped channel structure 107 is interposed, in the multi-stack nanosheet structure 30 is smaller than that in each of the multi-stack nanosheet structure 10 and 20. Thus, device characteristics of an FET including the U-shaped channel structure 107 in the multi-stack nanosheet structure 30 may also be differentiated in terms of at least an amount of current, device capacitance, a current leakage tolerance, etc., according to an embodiment.

Herebelow, a method of manufacturing the multi-stack nanosheet structure 10, 20 and 30 is described in reference to FIGS. 4A-4G and 5A-5C.

FIGS. 4A to 4G illustrate a method of manufacturing a multi-stack nanosheet structure including a U-shaped channel structure device, according to an embodiment. For brevity purposes, the method of manufacturing the multi-stack nanosheet structure 10 is described in reference to channel-length direction views of FIGS. 4A-4G.

Figures 4A, 4B:
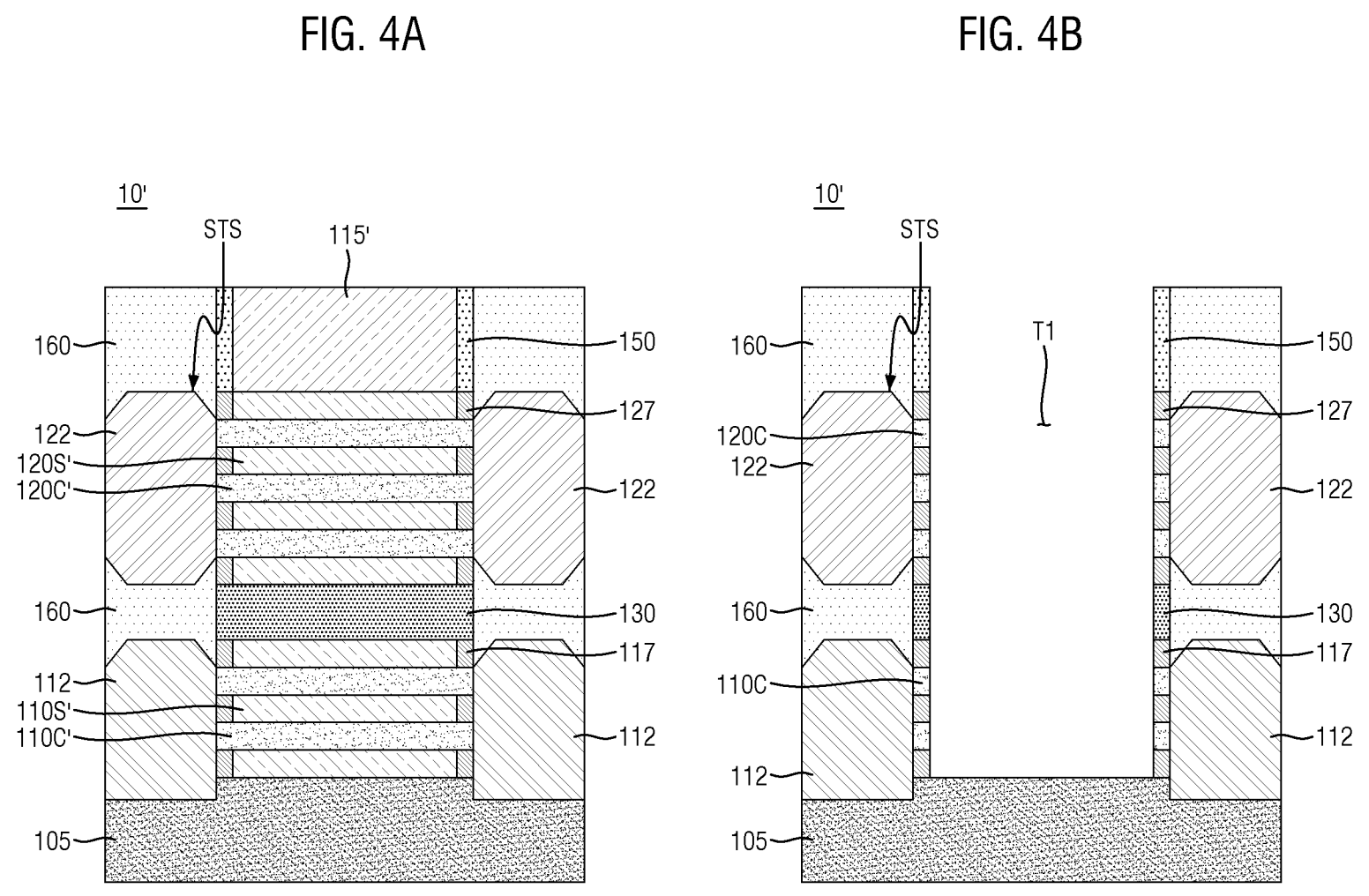
Figures 4C, 4D:
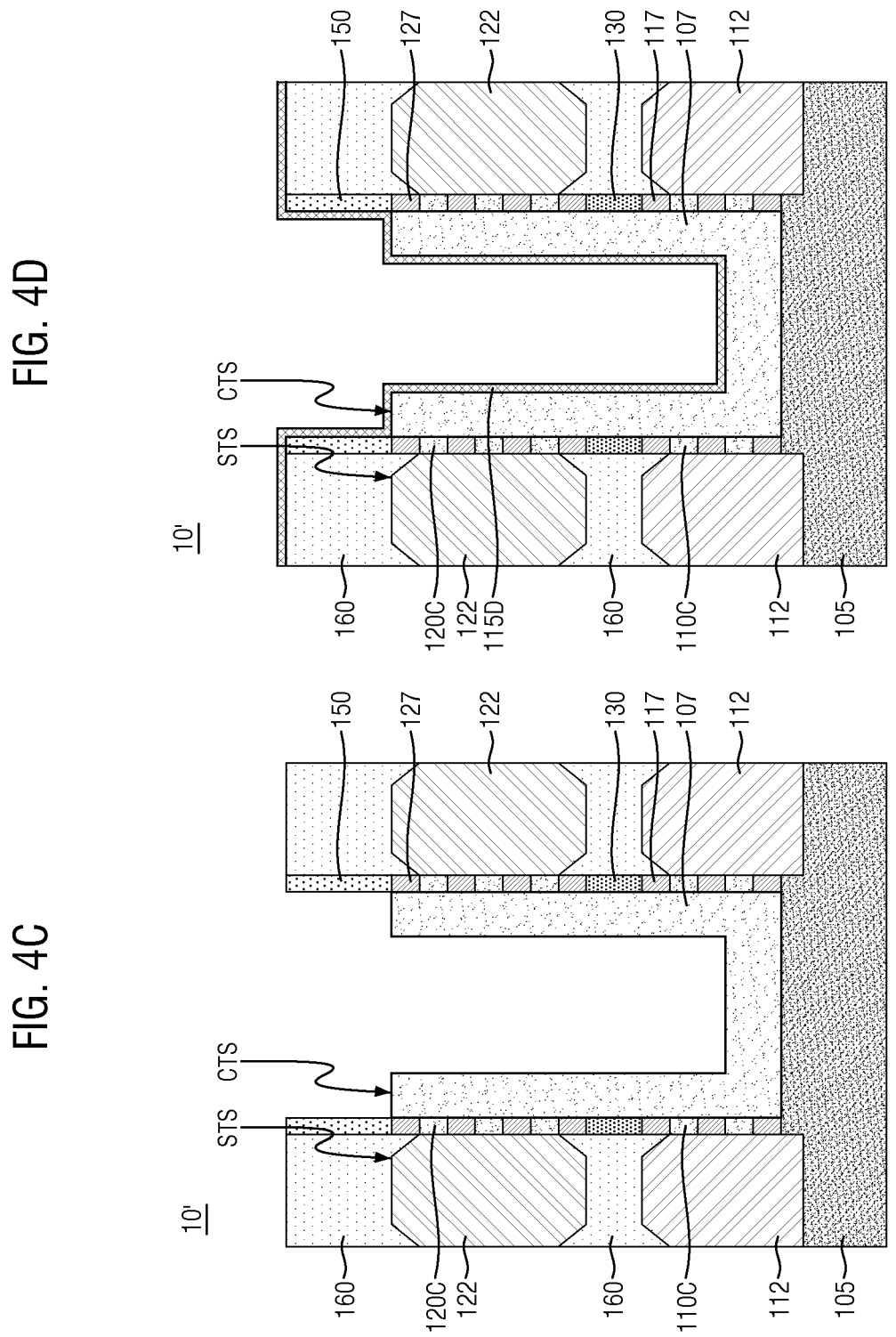

Referring to FIG. 4A, an intermediate structure 10' which is originally prepared to form a multi-stack semiconductor device is provided. According to embodiments, the intermediate structure 10' may be used as a base structure to form the multi-stack nanosheet structure 10 including the U-shaped channel structure 107 shown in FIGS. 1A-1C. Thus, the structural elements included in the intermediate structure 10' may be the same as or similar to those of the multi-stack nanosheet structure 10 shown in FIGS. 1A-1C. Accordingly, duplicate descriptions about these structural elements may be omitted, and the same reference numbers and characters shown in FIGS. 1A-1C may be used in FIGS. 4A-4G.

The intermediate structure 10' may include a lower nanosheet stack including a plurality of lower nanosheet sacrificial layers 110S' and lower nanosheet channel layers 110C' alternatingly stacked on the substrate 105, and an upper nanosheet stack including a plurality of upper nanosheet sacrificial layers 120S' and upper nanosheet channel layers 120C' alternatingly stacked above the lower nanosheet stack with the isolation layer 130 therebetween. FIG. 4A shows that three lower nanosheet sacrificial layers and two lower nanosheet channel layers are included in the lower nanosheet stack, and four upper nanosheet sacrificial layers and three upper nanosheet channel layers are included in the upper nanosheet stack. However, the disclosure is not limited to these numbers. According to embodiments, each of the lower nanosheet stack and the upper nanosheet stack may be formed of at least two lower nanosheet sacrificial layers and at least one lower nanosheet channel layer in the intermediate structure 10', and accordingly, the multi-stack nanosheet structure 10 to be formed from the intermediate structure 10' may include at least one lower-left nanosheet structure and at least one lower-right nanosheet structure, and at least one upper-left nanosheet structure and at least one upper-right nanosheet structure, according to embodiments.

A dummy gate structure 115' may be formed on the upper nanosheet stack. The dummy gate structure 115' may enclose the lower nanosheet stack and the upper nanosheet stack although not shown in the channel-length direction view of FIG. 4A.

The dummy gate structure 115' is referred to as such because this structure is not a gate structure of the multi-stack semiconductor device which would be formed from the intermediate structure 10', and instead, would be replaced by a replacement gate structure after supporting formation of other structures such as the source/drain regions 112 and 122 in a later step of manufacturing the multi-stack semiconductor device. Similarly, the nanosheet sacrificial layers 110S' and 120S' are referred to as such because these layers and structure would also be removed after supporting formation of other structures in a later step of manufacturing the multi-stack semiconductor device. The dummy gate structure 115' may be formed of polycrystalline silicon or amorphous silicon, and the nanosheet sacrificial layers 110S' and 120S' may be formed of silicon germanium (SiGe), not being limited thereto. The gate spacers 150 used as a mask structure to form at least lower inner spacers 117 and upper inner spacers 127 may be formed at sides of the dummy gate structure 115'.

The lower nanosheet channel layers 110C' may connect the lower source/drain regions 112 formed on both ends thereof, and the upper nanosheet channel layers 120C' may connect the upper source/drain regions 122 formed on both ends thereof.

Here, the lower source/drain regions 112 may have been epitaxially doped or ion-implanted with one or more p-type or n-type dopants, and the upper source/drain regions 122 may also have been doped or ion-implanted with one or more n-type or p-type dopants when the intermediate structure 10's provided in this step.

The inner spacers 117 and 127 may be formed in the intermediate structure 10' to isolate the source/drain regions 112 and 122 from the nanosheet sacrificial layers 110S' and 120S' that would be replaced by the replaced gate structure in the multi-stack semiconductor device. The ILD structure 160 may also be formed in the intermediate structure 10' to isolate the lower source/drain regions 112 and the upper source/drain regions 122 from each other and other circuit elements in an integrated circuit in which the multi-stack semiconductor device would be included.

Referring to FIG. 4B, the dummy gate structure 115' and the structural elements vertically therebelow may be removed through, for example, a photolithography and dry etching operation, not being limited thereto.

The removal operation in this step may be performed such that the nanosheet sacrificial layers 110S' and 120S' in their entireties if not all, and the central portions of the nanosheet channel layers 110C' and 120C' and the isolation layer 130 are removed. This removal operation may expose the top surface of the substrate 105, the end portions of the nanosheet channel layers 110C' and 120C' which are now the nanosheet structures 110C' and 120C', and the side surfaces the gate spacers 150 and the inner spacers 117 and 127 in a first trench T1.

Referring to FIG. 4C, an epitaxy process may be performed on the substrate 105 and the nanosheet structures 110C' and 120C' to grow the U-shaped channel structure 107 in the first trench T1.

In this epitaxy operation, the amount or time of epitaxial growth may be controlled such that the top surface of CTS of the U-shaped channel structure 107 is disposed at the substantially same level as the top surface STS of the upper source/drain regions 122, and thus, a substantial amount of the upper source/drain regions 122 overlaps the U-shaped channel structure 107 in the horizontal direction.

Referring to FIG. 4D, the gate dielectric layer 115D may be formed on the U-shaped channel structure 107 as an extra gate (EG) oxide layer having a thickness of, for example, about 4-5 nm, so that the gate dielectric layer 115D may have a high oxide breakdown voltage when the gate structure 115 including the gate dielectric layer 115D is driven.

The gate dielectric layer 115D may be layered on the inner surface and the top surface of the U-shaped channel structure 107, and the side surfaces of the gate spacers 150. The gate dielectric layer 115D may also be extended to be layered on a top surface of the ILD structure 160.

The formation of the gate dielectric layer 115D on the U-shaped channel structure 107 may be performed through, for example, an atomic layer deposition (ALD) technique.

Here, as described earlier, the gate dielectric layer 115D may have a sufficient thickness of, for example, about 4-5 nm to be formed as an EG oxide layer having a high oxide breakdown voltage.

Figures 4E, 4F:
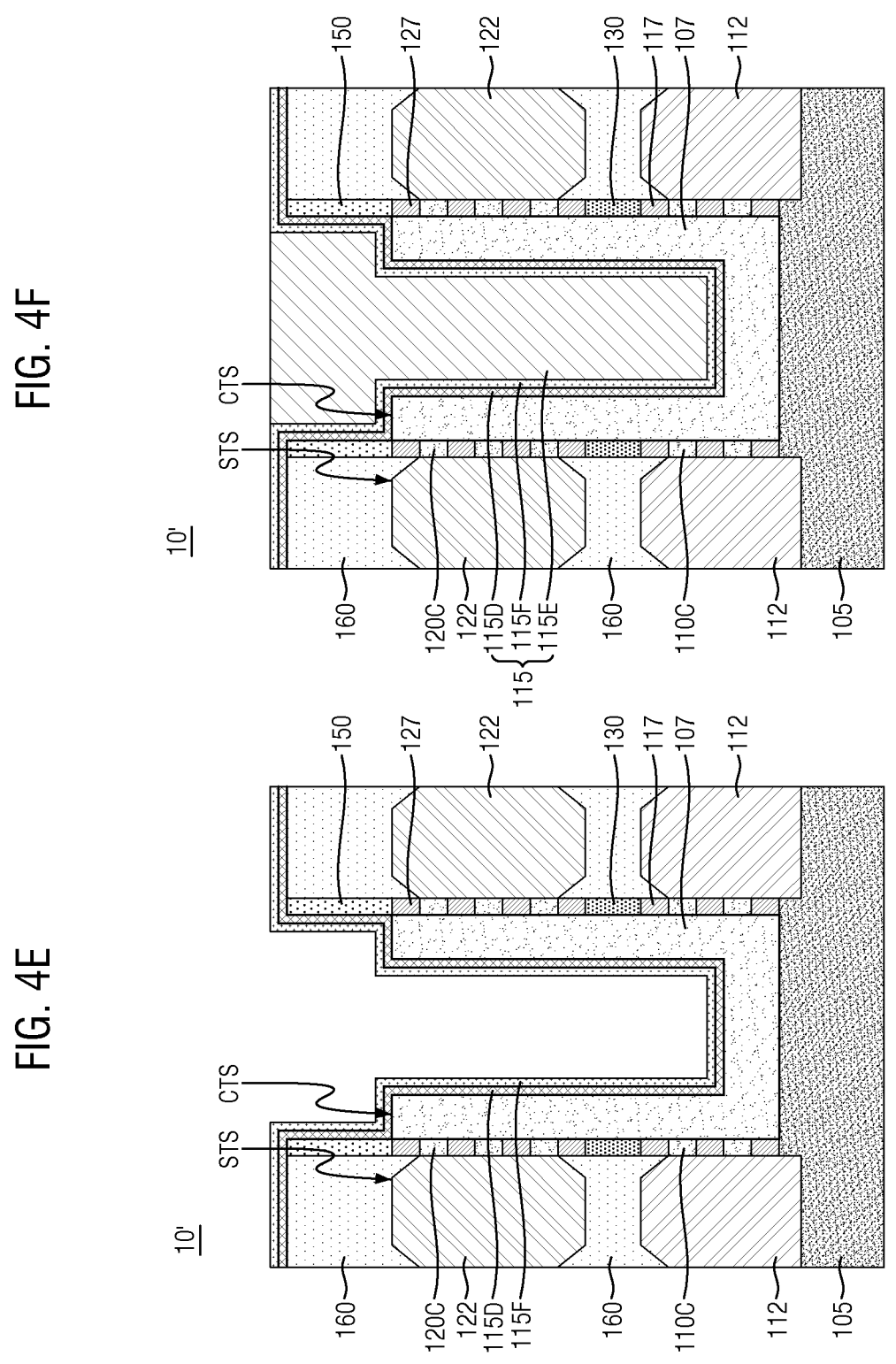

Referring to FIG. 4E, the work-function metal layer 115F may be formed on the gate dielectric layer 115D.

The formation of the work-function metal layer 115F on the gate dielectric layer 115D may also be performed through, for example, the ALD technique.

Referring to FIG. 4F, the gate electrode pattern 115E may be formed on the work-function metal layer 115F to complete the gate structure 115 of the multi-stack nanosheet structure 10.

The formation of the gate electrode pattern 115E to may be performed through, for example, physical vapor deposition (PVD), chemical vapor deposition (CVD), plasma enhanced chemical vapor deposition (PECVD), atomic layer deposition (ALD) or a combination thereof, not being limited thereto.

Figure 4G:
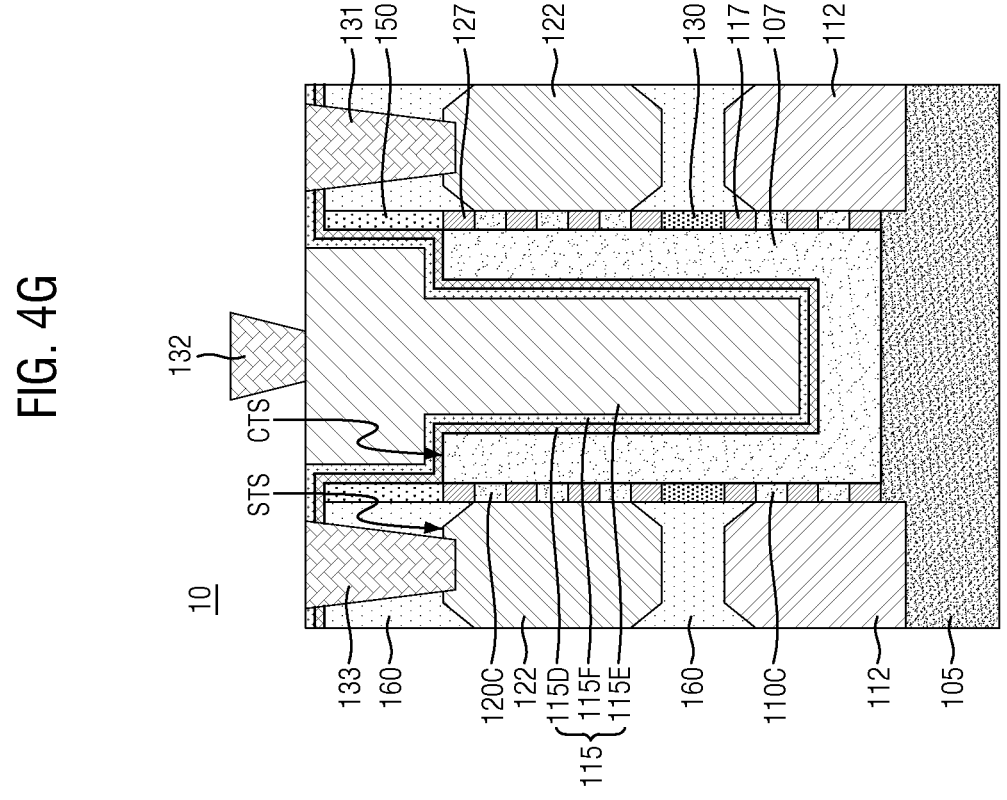

Referring to FIG. 4G, the source/drain region contact plugs 131 and 133 may be formed on the top surfaces of the upper source/drain regions 122, and the gate contact plug 132 may be formed on the gate electrode pattern 115E to finish up the multi-stack nanosheet structure 10.

The formation of the source/drain region contact plugs 131 and 133 may be performed by, for example, a photolithography and etching operation on the work-function metal layer 115F, the gate dielectric layer 115D, and the ILD structure 160 formed above the upper source/drain regions 122. The formation of the gate contact plug 132 may be performed in a similar manner on a top surface of the gate electrode pattern 115E.

Through the above operations, the multi-stack nanosheet structure 10 shown in FIGS. 1A-1C may be manufactured.

According to an embodiment, the multi-stack nanosheet structure 20 shown in FIG. 2 may be manufactured through the same operations described above in reference to FIGS. 4A-4G except the operation of growing the U-shaped channel structure 107 as shown in FIG. 4C.

Referring to FIG. 2, the multi-stack nanosheet structure 20 may be manufactured by controlling the amount or time of epitaxial growth such that the top surface CTS of the U-shaped channel structure 107 is lower than the top surface STS of the U-shaped channel structure 107 included in the multi-stack nanosheet structure 10. Thus, the degree of area overlap between the U-shaped channel structure 107 and the upper source/drain regions 122 becomes lower, while the distance between the gate structure 115 and the upper source/drain regions 122 becomes shorter because the horizontal portion of the gate structure 115 having the T shape becomes thicker.

Thus, as shown in FIG. 2, the multi-stack nanosheet structure 20 manufactured through this method may be used as an one-time programmable (OTP) electrical fuse (eFuse) in which a current may flow through a breakdown channel BC from the upper source/drain region 122 to the gate structure 115 when a high voltage, e.g., 3 V or more, is applied to the upper source/drain region 122 through the upper source/drain region contact plug 133 and a ground voltage is applied to the gate structure 115 through the gate contact plug 131.

According to an embodiment, the multi-stack nanosheet structure 30 shown in FIG. 3 may be manufactured through the same operations described above in reference to FIGS. 4A-4E, and then, the following operations are performed.

Figures 5A, 5B:
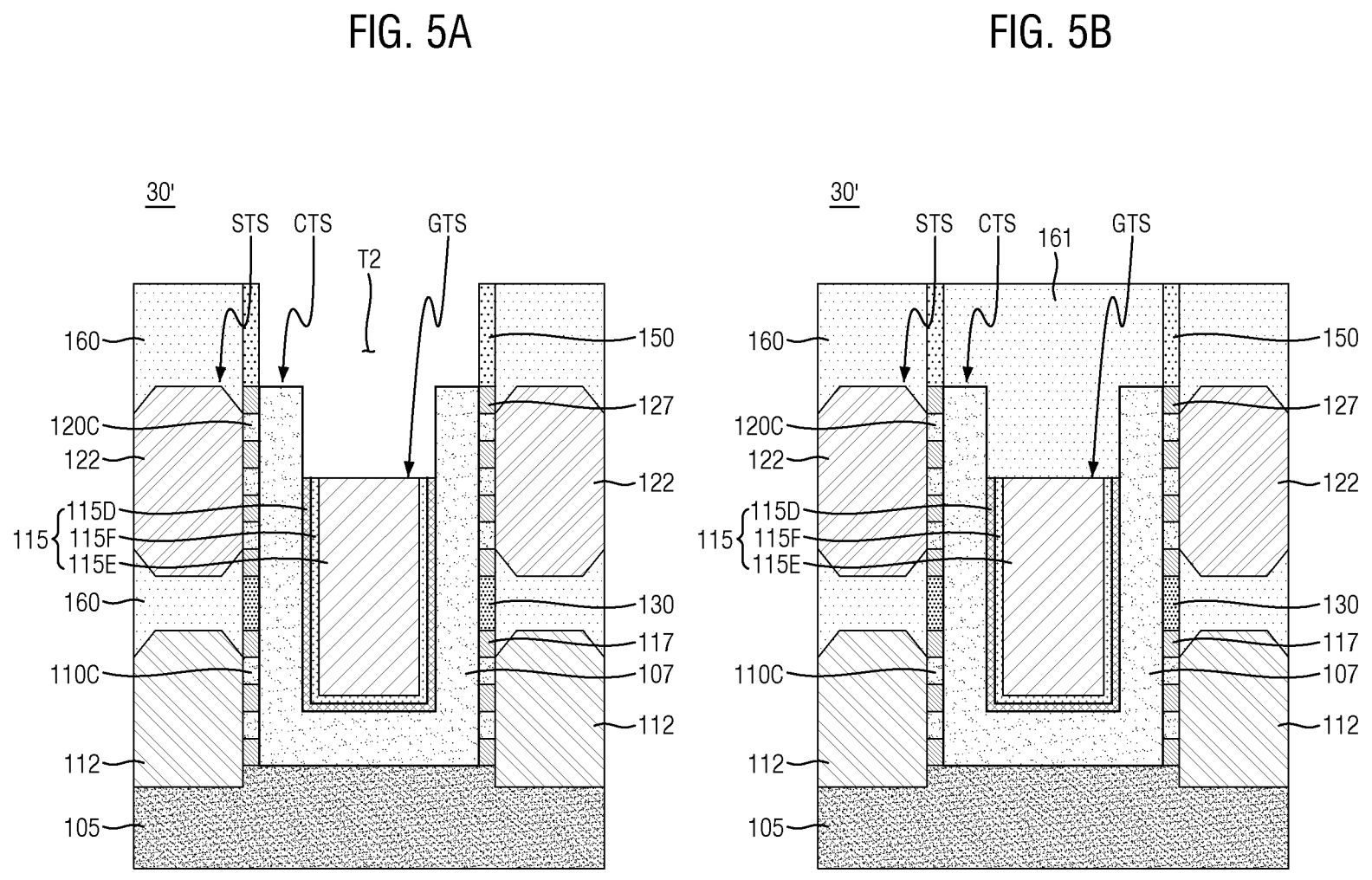
Figure 5C:
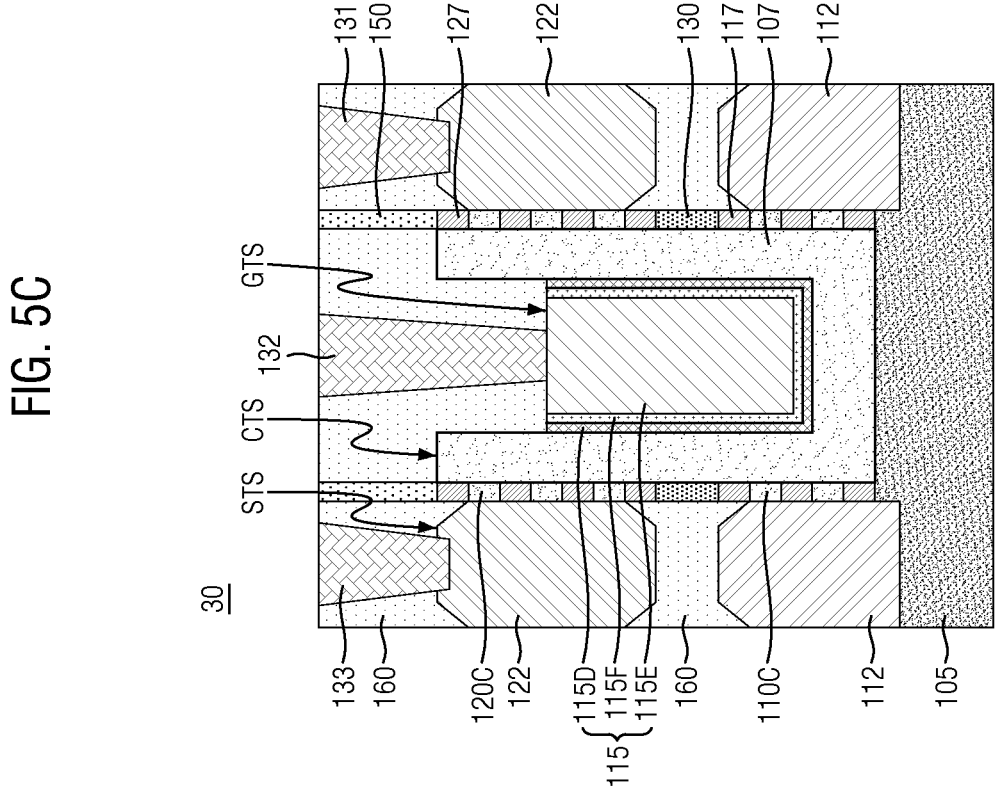

FIGS. 5A to 5C illustrate a method of manufacturing a multi-stack nanosheet structure including a U-shaped channel structure device and a small-size gate structure, according to an embodiment;

Referring to FIG. 5A, a metal recess operation may be performed on the gate structure 115 in the intermediate structure 10' shown in FIG. 4E to obtain an intermediate structure 30'.

Through this metal recess operation, a portion of the gate structure 115 formed on the U-shaped channel structure 107 may be removed down to a level below the top surface of the U-shaped channel structure 107. Thus, a second trench T2 may be formed on the U-shaped channel structure 107 and a top surface of the remaining gate structure 115 between the gate spacers 150.

The metal recess operation in this step may be performed through, for example, stripping of the work-function metal layer 115F and the gate dielectric layer 115D on the ILD structure 160 above the upper source/drain regions 122, followed by photolithography and dry etching on the horizontal portion and an upper part of the vertical portion of the T-shaped gate structure 115 shown in FIG. 4E. Here, the dry etching on the gate structure 115 against the silicon-based U-shaped channel structure 107 may be performed using, for example, a plasma gas including boron trichloride (BCl$_3$), not being limited thereto.

Referring to FIG. 5B, an additional ILD structure 161 may be formed on the gate structure 115, remaining after the metal recess operation thereon in the previous step, and the U-shaped channel structure 107 in the intermediate structure 30'.

The additional ILD structure 161 formed in this step may fill in the second trench T2 formed on the U-shaped channel structure 107 and the top surface of the remaining gate structure 115 between the gate spacers 150.

Referring to FIG. 5C, the source/drain region contact plugs 131 and 133 may be formed on the top surfaces of the upper source/drain regions 122, and the gate contact plug 132 may be formed on the gate electrode pattern 115E to finish up the multi-stack nanosheet structure 30.

The formation of the source/drain region contact plug 131 may be performed by, for example, a photolithography and etching operation on the work-function metal layer 115F, the gate dielectric layer 115D, and the ILD structure 160 formed above the upper source/drain regions 122.

Through the above operations, the multi-stack nanosheet structure 30 shown in FIG. 3 may be manufactured.

Thus far, various embodiments of a multi-stack nanosheet structure are provided in which a field-effect transistor or an eFuse including a U-shaped channel structure is formed. However, the disclosure is not limited to these embodiments. The U-shaped channel structure formed in the multi-stack nanosheet structure may also be used to form a bipolar junction transistor (BJT) or a PN diode as described below.

Figures 6A, 6B, 6C:
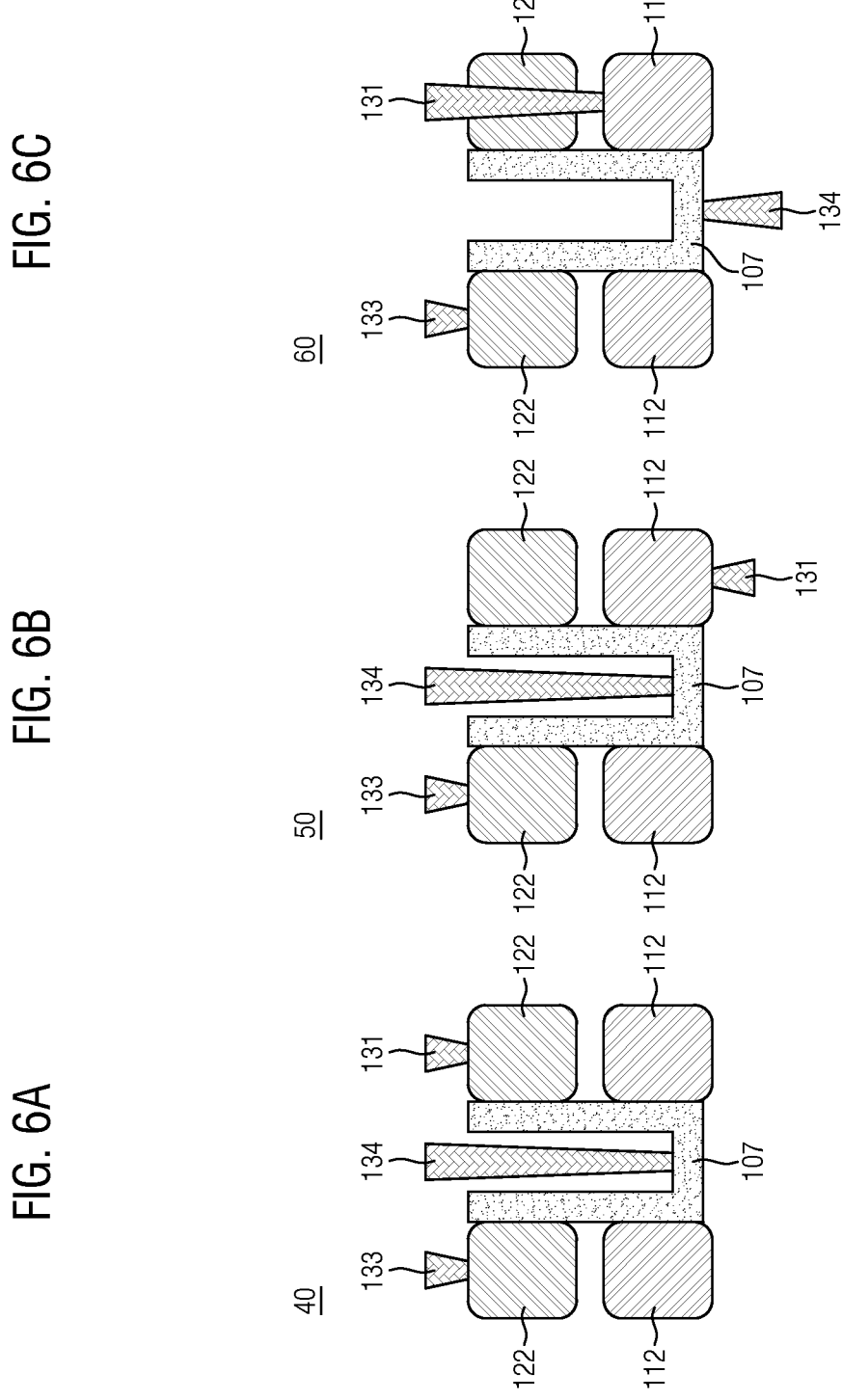
FIGS. 6A-6C illustrate respective multi-stack nanosheet structures in which a BJT including a U-shaped channel structure and source/drain regions is formed, according to embodiments

FIGS. 6A-6C illustrate respective multi-stack nanosheet structures in which a BJT including a U-shaped channel structure and source/drain regions is formed, according to embodiments.

FIGS. 6A-6C show multi-stack nanosheet structures 40, 50 and 60, in each of which a BJT is formed based on the U-shaped channel structure 107 and the source/drain regions 112 and 122 included in the intermediate structure 10' shown in FIG. 4A, in a simplified form.

According to embodiments, the U-shaped channel structure 107 in each of the multi-stack nanosheet structures 40, 50 and 60 may include one or more n-type or p-type dopants while the upper source/drain regions 122 and/or the lower source/drain regions 112 include one or more p-type or n-type dopants though epitaxial doping or ion implantation. The p-type dopants may include boron (B), gallium (Ga), etc. and the n-type dopants phosphorous (As), arsenic (Sb), indium (In), etc.

Various other structural elements shown in FIG. 1A for the multi-stack nanosheet structure 10 including the nanosheet structures 110C and 120C may also be included in each of the multi-stack nanosheet structures 40, 50 and 60 except the gate structure 115 which may not be necessary or required to form a BJT, according to embodiments.

Referring to FIG. 6A, a BJT may be formed of the U-shaped channel structure 107 and the upper source/drain regions 122 connected to each other by the U-shaped channel structure 107. Here, the upper source/drain regions 122 may each include a p-type or n-type dopant while the U-shaped channel structure 107 includes an n-type or p-type dopant, respectively, so that the BJT may be an NPN or PNP transistor. At this time, source/drain region contact plugs 131 and 133 formed on the upper source/drain regions 122 and a channel contact plug 134 formed on the U-shaped channel structure 107 may be an MOL or BEOL structure in a front side of the multi-stack nanosheet structure 40, according to an embodiment.

Referring to FIG. 6B, a BJT may be formed of the U-shaped channel structure, one of the upper source/drain regions 122 and one of the lower source/drain regions 112 at the opposite side connected to each other by the U-shaped channel structure 107. Here, each of the upper source/drain region 122 and the lower source/drain region 112 may include a p-type or n-type dopant while the U-shaped channel structure 107 includes an n-type dopant so that the BJT may be an NPN or PNP transistor. At this time, the source/drain region contact plug 133 formed on the upper source/drain region 122 and a channel contact plug 134 may be an MOL or BEOL structure in a front side of the multi-stack nanosheet structure 50, and the source/drain region contact plug 131 formed on the lower source/drain region 112 may be a backside contact plug formed in a back side of the multi-stack nanosheet structure 50 which may be the substrate 105, according to an embodiment. The backside contact plug may be connected to a buried power rail (BPR) of a back side power distribution network (BSPDN) formed in the substrate 105.

Referring to FIG. 6C, a BJT may be formed of the U-shaped channel structure 107 and one of the upper source/drain regions 122 and one of the lower source/drain regions 112 at the opposite side connected to each other by the U-shaped channel structure 107. Here, each of the upper source/drain region 122 and lower source/drain region 112 may include a p-type or n-type dopant while the U-shaped channel structure 107 includes an n-type dopant so that the BJT may be an NPN or PNP transistor. At this time, the source/drain region contact plugs 131 and 133 formed on the lower source/drain region 112 and the upper source/drain region 122, respectively, may be an MOL or BEOL structure in a front side of the multi-stack nanosheet structure 50, and the channel contact plug 134 may be a backside contact plug formed in a back side of the multi-stack nanosheet structure 50 which may be the substrate 105, according to an embodiment. The backside contact plug may be connected to a buried power rail (BPR) of a back side power distribution network (BSPDN) formed in the substrate 105.

Further, in FIG. 6C, the source/drain region contact plug 131 may be extended down from the front side of the multi-stack nanosheet structure 60 to a top surface of the lower source/drain region 112 through a space provided at a side of the upper source/drain region 122 formed on a smaller-width upper nanosheet structures 120C and on the lower source/drain region 112 formed on a greater-width lower nanosheet structures 110C, as shown in FIG. 1C It is understood here that the above embodiments of the multi-stack nanosheet structure 40, 50 and 60 described in reference to FIGS. 6A-6C are only a few examples of forming a BJT based on the upper source/drain regions 122, the lower source/drain regions 112 and the U-shaped channel structure 107. Thus, these structural elements may be combined in various different manners by differently doping or implanting one or more p-type or n-type dopants in the source/drain regions 112 and 122 and differently connecting the contact plugs 131, 133 and 134, according to embodiments. This is because each of the lower source/drain regions 112 and each of the upper source/drain regions 122, which may include an n-type or p-type dopant, may be connected to a power source or another circuit element through source/drain region contact plug 131 or 133 which may be formed as either a front side contact plug or a backside contact plug, and the U-shaped channel structure 107 may also include an n-type or p-type dopant.

Further, similar to the various field-effect transistors implemented in the multi-stack nanosheet structure 10, 20 or 30 shown in FIGS. 1A-1C to 3, one of the lower source/drain region 112 and the upper source/drain region 122 on a same side with respect to the U-shaped channel structure 107 in the multi-stack nanosheet structure 40, 50 or 60 includes an n-type or p-type dopant, the other of the lower source/drain region 112 and the upper source/drain region 122 may also include an n-type dopant or may not include any dopants, according to an embodiment.

The multi-stack nanosheet structures 40, 50 and 60 including the respective BJTs may be manufactured through the same operations described in reference to FIGS. 4A-4C for manufacturing the multi-stack nanosheet structure 10, 20 or 30 including the respective field-effect transistors. Thus, duplicate descriptions thereof are omitted herein.

Once the intermediate structure 10' shown in FIG. 4C is obtained, the U-shaped channel structure 107 included therein may be doped or implanted with one or more p-type or n-type dopants, and then, the contact plugs 131, 133 and 134 may be formed on the front side or the backside of the intermediate structure 10' to form the multi-stack nanosheet structure 40, 50 or 60.

In the above embodiments, BJTs may be formed based on the U-shaped channel structure 107 included in the intermediate structure 10' shown in FIG. 4A. However, BJTs may also be formed without forming the U-shaped channel structure 107 in the intermediate structure 10' shown in FIG. 4A, as described below.

Figure 7:
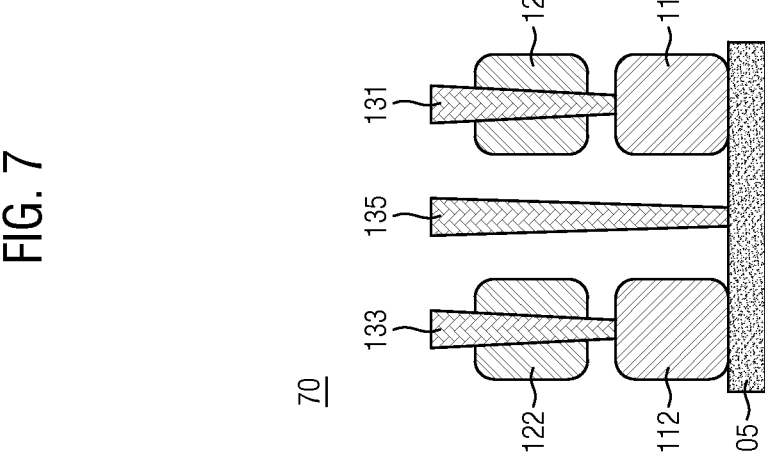
FIG. 7 illustrates a multi-stack nanosheet structures in which a BJT including a substrate and source/drain regions is formed, according to embodiments.

FIG. 7 illustrates a multi-stack nanosheet structures in which a BJT including a substrate and source/drain regions is formed, according to embodiments.

FIG. 7 shows a multi-stack nanosheet structure 70 in which a BJT is formed based on the substrate 105 and the lower source/drain regions 112 included in the intermediate structure 10' shown in FIG. 4A, in a simplified form.

According to an embodiment, the substrate 105 may include one or more n-type or p-type dopants though epitaxial doping or ion implantation while the upper source/drain regions 122 and/or the lower source/drain regions 112 include one or more p-type or n-type dopants. The p-type dopants may include boron (B), gallium (Ga), etc. and the n-type dopants phosphorous (As), arsenic (Sb), indium (In), etc.

Various other structural elements shown in FIG. 1A for the multi-stack nanosheet structure 10 including the nanosheet structures 110C and 120C may also be included in the multi-stack nanosheet structure 70 except the U-shaped channel structure 107 and the gate structure 115 which may not be necessarily or required to form a BJT, according to an embodiment.

Referring to FIG. 7, a BJT may be formed of the substrate 105 including one or more dopants and the lower source/drain regions 112 formed on the substrate 105. Here, the lower source/drain regions 112 may each include a p-type or n-type dopant so that the BJT may be an NPN or PNP transistor. At this time, source/drain region contact plugs 131 and 133 formed on the upper source/drain regions 122 and a channel contact plug 132 formed on the U-shaped channel structure 107 may be an MOL or BEOL structure in a front side of the multi-stack nanosheet structure 40, according to an embodiment.

A substrate contact plug 135 and the source/drain region contact plugs 131 and 133 may be extended down from the front side of the multi-stack nanosheet structure 60 to top surfaces of the lower source/drain regions 112 through a space provided at a side of the upper source/drain regions 122 formed on a smaller-width upper nanosheet structures 120C and on the lower source/drain regions 112 formed on a greater-width lower nanosheet structures 110C, as shown in FIG. 1C. However, this contact plug connection may be made possible by securing an additional space at a side of the multi-stack nanosheet structure 70 even when the lower nanosheet structures 110C and the upper nanosheet structures 120C have an equal width, according to embodiments.

Further, at least one of the contact plugs 131, 133 and 135 may be a backside contact plug formed in a back side of the multi-stack nanosheet structure 70 which may be the substrate 105, according to an embodiment. The backside contact plug may be connected to a buried power rail (BPR) of a back side power distribution network (BSPDN) formed in the substrate 105.

The multi-stack nanosheet structure 70 including the BJT may be manufactured through the same operations described in reference to FIGS. 4A-4B for manufacturing the multi-stack nanosheet structure 10, 20 or 30 including the respective field-effect transistors. Thus, duplicate descriptions thereof are omitted herein.

Once the intermediate structure 10' shown in FIG. 4B is obtained, the substrate 105 may be doped or implanted with one or more p-type or n-type dopants, and then, the contact plugs 131, 133 and 135 may be formed on the front side and/or the backside of the intermediate structure 10' to form the multi-stack nanosheet structure 70.

In the above embodiments, each of the multi-stack nanosheet structures 10 to 70 shown in FIGS. 1A-1C to FIG. 7 may include all of the lower source/drain regions 112 and the upper source/drain regions 122. However, when a field-effect transistor, an eFuse or a BJT is formed, at least one of the lower-left source/drain region and the upper-left source/drain region and at least one of the lower-right source/drain region and the upper-right source/drain region may not be necessary or required in forming the field-effect transistor, the eFuse or the BJT. In this case, the unnecessary or non-required source/drain region may not include any dopants, or may not even be included in the corresponding multi-stack nanosheet structure by not being formed in the intermediate structure 10' shown in FIG. 4A, according to embodiments.

Further, in the above embodiments, each of the multi-stack nanosheet structures 10 to 70 shown in FIGS. 1A-1C to FIG. 7 may form a field-effect transistor, an eFuse or a BJT therein. However, since the multi-stack nanosheet structures 10 to 70 may all be based on the intermediate structure 10' originally prepared for manufacturing the multi-stack semiconductor device including the lower nanosheet transistor and the upper nanosheet transistor, two or more of the multi-stack nanosheet structure 10 to 70 may be formed based on an extended nanosheet channel layers 110C' and 120C' in the intermediate structure 10' and co-exist in an integrated circuit manufactured based on the intermediate structure 10', according to embodiments. Further, at least one of multi-stack nanosheet structures 10 to 70 and the originally-intended multi-stack semiconductor device may also be formed based on the extended nanosheet channel layers 110C' and 120C' in the intermediate structure 10' and co-exist in an integrated circuit manufactured based on the intermediate structure 10', according to embodiments.

Figure 8:
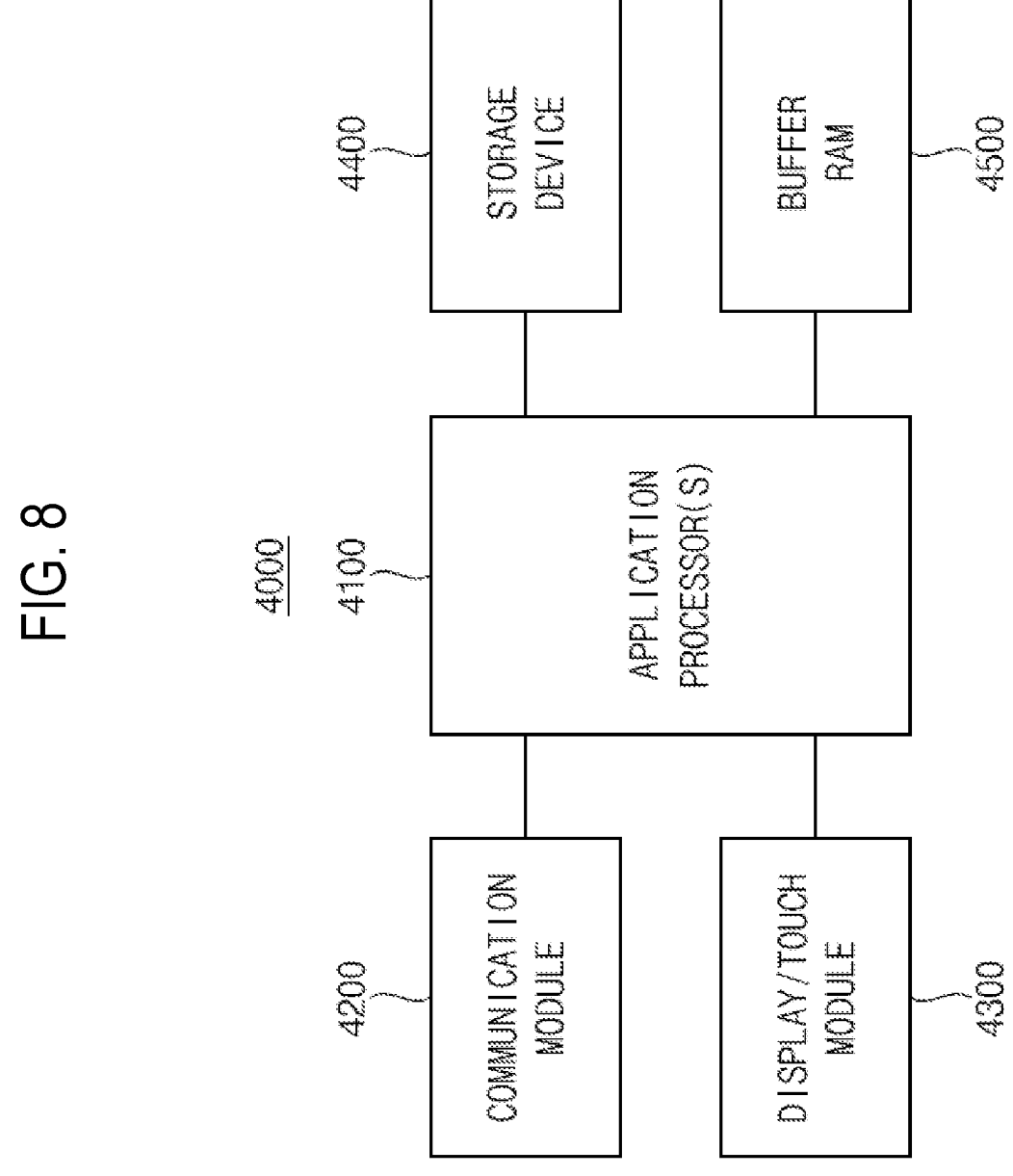
FIG. 8 is a schematic block diagram illustrating an electronic device including at least one of the multi-stack nanosheet structures shown in FIGS. 1A-1C to 7, according to an example embodiment.

FIG. 8 is a schematic block diagram illustrating an electronic device including at least one of the multi-stack nanosheet structures shown in FIGS. 1A-1C to 7, according to an example embodiment.

Referring to FIG. 13, an electronic device 4000 may include at least one application processor 4100, a communication module 4200, a display/touch module 4300, a storage device 4400, and a buffer RAM 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the electronic device 4000 may include the multi-stack nanosheet structure described above in reference to FIGS. 1A-1C to FIG. 7.

The foregoing is illustrative of exemplary embodiments and is not to be construed as limiting the disclosure. Although a few exemplary embodiments have been described, those skilled in the art will readily appreciate that many modifications are possible in the above embodiments without materially departing from the disclosure.

What is claimed is:

1. A multi-stack nanosheet structure comprising:
a substrate;
at least a first nanosheet structure and at least a second nanosheet structure, above the substrate, separated from each other, wherein the first nanosheet structure and second nanosheet structure are adjacent to each other;
a channel structure comprising a first portion on the first nanosheet structure, a second portion on the second nanosheet structure, and a third portion on the substrate between the first and second portions, wherein the first portion, the second portion and the third portion form a single continuous structure;
a gate structure between the first and second portions on the third portion of the channel structure, wherein the gate structure comprises a gate dielectric layer comprising oxide; and
at least a first source/drain region on the first nanosheet structure, and at least a second source/drain region on the second nanosheet structure, wherein the first source/drain region and the second source/drain region comprise an n-type or p-type dopant.

2. The multi-stack nanosheet structure of claim 1, wherein the first nanosheet structure comprises a lower-first nanosheet structure and an upper-first nanosheet structure, and the second nanosheet structure comprises a lower-second nanosheet structure and an upper-second nanosheet structure,
wherein the second source/drain region comprises a lower-second source/drain region and an upper-second source/drain region, one of which is on the lower-second nanosheet structure or the upper-second nanosheet structure, and
wherein the first source/drain region is on the lower-first nanosheet structure or the upper-first nanosheet structure, and the second source/drain region is on the lower-second source/drain region or the upper-second source/drain region.

3. The multi-stack nanosheet structure of claim 2, wherein the first source/drain region comprises a lower-first source/drain region and an upper-first source/drain region, one of which is on the lower-first nanosheet structure or the upper-first nanosheet structure.

4. The multi-stack nanosheet structure of claim 3, further comprising:
a first source/drain region contact plug on the lower-second source/drain region or the upper-second source/drain region which comprises the n-type or p-type dopant;
a second source/drain region contact plug on the lower-second source/drain region or the upper-second source/drain region which comprises the n-type or p-type dopant; and
a gate contact plug on the gate structure.

5. The multi-stack nanosheet structure of claim 4, wherein at least one of the first source/drain region contact plug, the second source/drain region contact plug, and the gate contact plug is below a top surface of the substrate at a back side of the multi-stack nanosheet structure.

6. The multi-stack nanosheet structure of claim 3, wherein the channel structure is on the substrate, the lower-first nanosheet structure, the upper-first nanosheet structure, the lower-second nanosheet structure, and the upper-second nanosheet structure.

7. The multi-stack nanosheet structure of claim 1, wherein the channel structure has a shape of character "U".

8. The multi-stack nanosheet structure of claim 7, wherein the gate structure has a shape of character "T".

9. The multi-stack nanosheet structure of claim 1, wherein top surfaces of the first and second portions of the channel structure are at a substantially same level as top surfaces of the first and second source/drain regions.

10. The multi-stack nanosheet structure of claim 1, wherein top surfaces of the first and second portions of the channel structure are at a level below top surfaces of the first and second source/drain regions.

11. The multi-stack nanosheet structure of claim 10, wherein one of the first and second source/drain regions and the gate structure forms an electrical fuse (eFuse).

12. The multi-stack nanosheet structure of claim 1, wherein a top surface of the gate structure is at a level below top surfaces of the first and second portions of the channel structure.

13. The multi-stack nanosheet structure of claim 12, wherein the top surface of the gate structure is at a level below top surfaces of the first and second source/drain regions.

14. A multi-stack nanosheet structure comprising:
a substrate;
at least a first nanosheet structure and at least a second nanosheet structure above the substrate separated from each other;
a channel structure comprising a first portion on the first nanosheet structure, a second portion on the second nanosheet structure, and a central portion on the substrate between the first and second portions, wherein the first portion, the central portion and the second portion form a single continuous structure; and
at least a first source/drain region on the first nanosheet structure, and at least a second source/drain region on the second nanosheet structure,
wherein the channel structure comprises an n-type or p-type dopant, and
wherein the first source/drain region and the second source/drain region comprise a dopant having a polarity opposite to the n-type or p-type dopant in the channel structure.

15. The multi-stack nanosheet structure of claim 14, wherein the first nanosheet structure comprises a lower-first nanosheet structure and an upper-first nanosheet structure, and the second nanosheet structure comprises a lower-second nanosheet structure and a upper-second nanosheet structure,
wherein the second source/drain region comprises a lower-second source/drain region and an upper-second source/drain region, one of which is on the lower-second nanosheet structure or the upper-second nanosheet structure, and
wherein the first source/drain region is on the lower-first nanosheet structure or the upper-first nanosheet structure, and the second source/drain region is on the lower-second source/drain region or the upper-second source/drain region.

16. The multi-stack nanosheet structure of claim 15, wherein the first source/drain region comprises a lower-first source/drain region and an upper-first source/drain region, one of which is on the lower-first nanosheet structure or the upper-first nanosheet structure.

17. The multi-stack nanosheet structure of claim 16, further comprising:
a first source/drain region contact plug on the lower-second source/drain region or the upper-second source/drain region which comprises the n-type or p-type dopant;
a second source/drain region contact plug on the lower-second source/drain region or the upper-second source/drain region which comprises the n-type or p-type dopant; and
a channel contact plug on the channel structure.

18. The multi-stack nanosheet structure of claim 17, wherein at least one of the first source/drain region contact plug, the second source/drain region contact plug, and the channel contact plug is below a top surface of the substrate at a back side of the multi-stack nanosheet structure.

19. The multi-stack nanosheet structure of claim 16, wherein the channel structure is on the substrate, the lower-first nanosheet structure, the upper-first nanosheet structure, the lower-second nanosheet structure, and the upper-second nanosheet structure, and
wherein the channel structure has a shape of character "U".

20. The multi-stack nanosheet structure of claim 14, wherein the first and second source/drain regions and the channel structure forms a bipolar junction transistor (BJT).

21. A multi-stack nanosheet structure comprising:
a substrate;
at least a first nanosheet structure and at least a second nanosheet structure above the substrate separated from each other; and
at least a first source/drain region on the first nanosheet structure, and at least a second source/drain region on the second nanosheet structure, wherein the second source/drain region comprises a lower-second source/drain region and an upper-second source/drain region,
a gate structure;
a first source/drain region contact plug on the lower-second source/drain region or the upper-second source/drain region which comprises an n-type or p-type dopant;
a second source/drain region contact plug on the lower-second source/drain region or the upper-second source/drain region which comprises the n-type or p-type dopant; and
a substrate contact plug on the gate structure,
wherein the substrate comprises the n-type or p-type dopant, and
wherein the first source/drain region and the second source/drain region comprise a dopant having a polarity opposite to the n-type or p-type dopant in the substrate.

22. The multi-stack nanosheet structure of claim 21, wherein the first nanosheet structure comprises a lower-first nanosheet structure and an upper-first nanosheet structure, and the second nanosheet structure comprises a lower-second nanosheet structure and a upper-second nanosheet structure, and
wherein the first source/drain region is on the lower-first nanosheet structure or the upper-first nanosheet structure, and the second source/drain region is on the lower-second source/drain region or the upper-second source/drain region.

23. The multi-stack nanosheet structure of claim 22, wherein the first source/drain region comprises a lower-first source/drain region and an upper-first source/drain region, one of which is on the lower-first nanosheet structure or the upper-first nanosheet structure, and
wherein one of the lower-second source/drain region or the upper-second source/drain region is on the lower-second nanosheet structure or the upper-second nanosheet structure.

24. The multi-stack nanosheet structure of claim 21, wherein at least one of the first source/drain region contact plug, the second source/drain region contact plug, and the substrate contact plug is below a top surface of the substrate at a back side of the multi-stack nanosheet structure.

25. The multi-stack nanosheet structure of claim 21, wherein the first and second source/drain regions and a channel structure forms a bipolar junction transistor (BJT).

* * * * *